(12) United States Patent
Goto

(10) Patent No.: US 6,897,656 B2
(45) Date of Patent: May 24, 2005

(54) MAGNETIC FIELD HOMOGENIZING METHOD AND APPARATUS, AND MAGNETIC FIELD GENERATING APPARATUS

(75) Inventor: Takao Goto, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 11 days.

(21) Appl. No.: 10/641,871

(22) Filed: Aug. 15, 2003

(65) Prior Publication Data

US 2004/0036472 A1 Feb. 26, 2004

(30) Foreign Application Priority Data

Aug. 26, 2002 (JP) ......................................... 2002-244897

(51) Int. Cl.[7] .................................................. G01V 3/00
(52) U.S. Cl. ........................................ 324/320; 324/318
(58) Field of Search ............................... 324/320, 318, 324/309, 307, 319, 322; 335/216, 299

(56) References Cited

U.S. PATENT DOCUMENTS

| | | | | |
|---|---|---|---|---|
| 3,515,979 A | * | 6/1970 | Golay | ......................... 324/319 |
| 3,566,255 A | * | 2/1971 | Jaynes | ......................... 324/320 |
| 4,680,551 A | | 7/1987 | O'Donnell et al. | ......... 324/318 |
| 5,345,208 A | | 9/1994 | Dorri et al. | .................. 335/301 |
| 5,391,990 A | | 2/1995 | Schmitt et al. | ............. 324/320 |
| 5,431,165 A | * | 7/1995 | Sellers | ........................ 600/422 |
| 5,773,976 A | | 6/1998 | Sakakura et al. | ........... 324/309 |
| 5,798,679 A | * | 8/1998 | Pissanetzky | ................. 335/299 |
| 6,313,634 B1 | * | 11/2001 | Kasten | ........................ 324/320 |
| 6,489,765 B2 | | 12/2002 | Goto | .......................... 324/307 |
| 6,528,999 B1 | | 3/2003 | Nauerth | ...................... 324/309 |

* cited by examiner

Primary Examiner—Brij B. Shrivastav
(74) Attorney, Agent, or Firm—Carl B. Horton, Esq.; Armstrong Teasdale LLP

(57) ABSTRACT

For the purpose of efficiently homogenizing a magnetic field, when homogenizing a strength distribution of a magnetic field generated in a space between a pair of facing pole surfaces, a continuous magnetization distribution for homogenizing the strength distribution of the magnetic field is determined with respect to planes on which magnetic elements are to be disposed for homogenizing the strength distribution of the magnetic field; and magnetic elements are disposed based on the magnetization distribution. The magnetic distribution is determined as a polynomial of an orthogonal function. The polynomial is determined by an optimization method. The optimization method is a method of least squares.

19 Claims, 6 Drawing Sheets

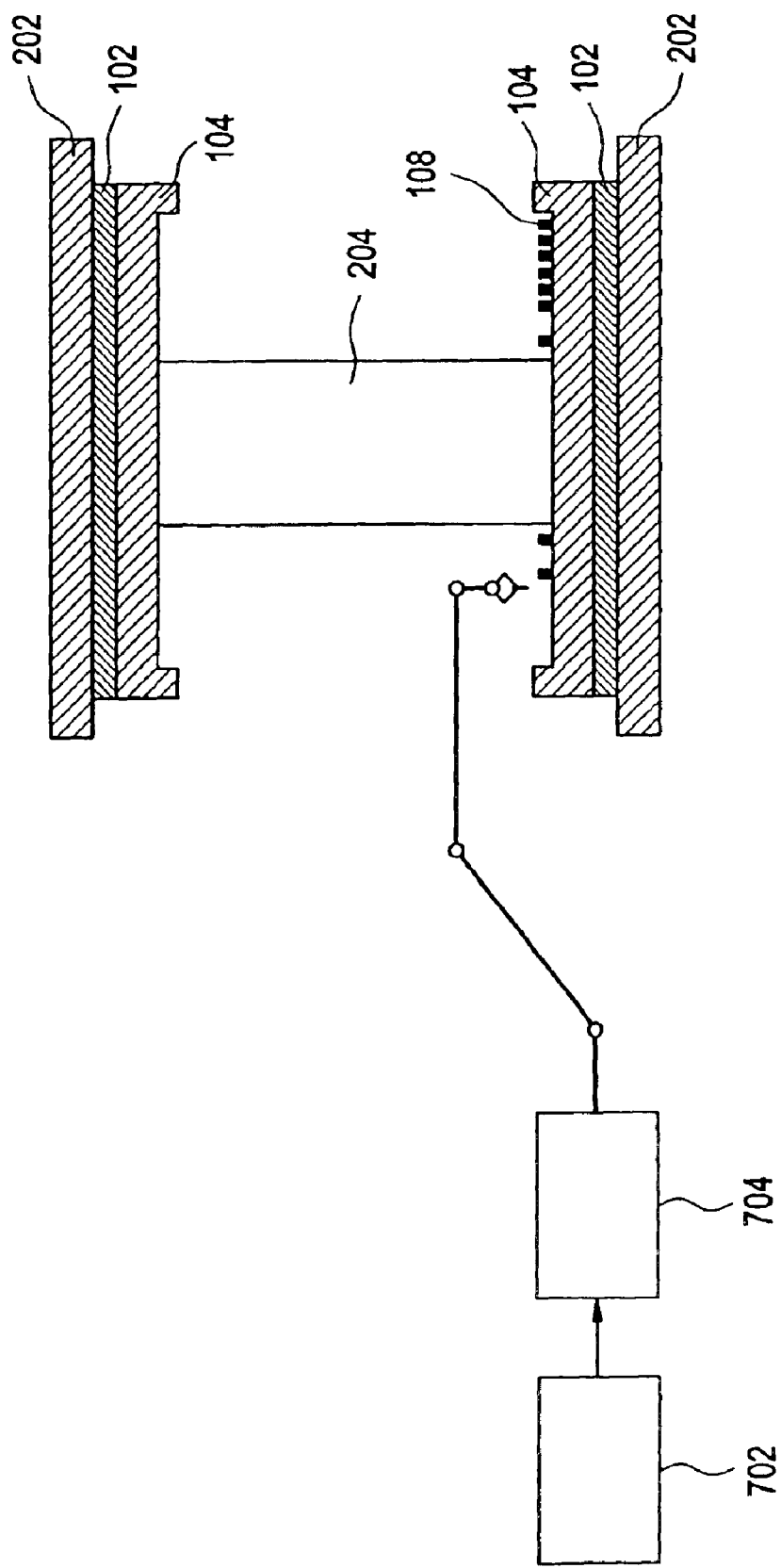

MAGNETIC FIELD HOMOGENIZING METHOD AND APPARATUS, AND MAGNETIC FIELD GENERATING APPARATUS

CROSS REFERENCE TO RELATED APPLICATIONS

This application claims the benefit of Japanese Application No. 2002-244897 filed Aug. 26, 2002.

BACKGROUND OF THE INVENTION

The present invention relates to a magnetic field homogenizing method and apparatus, and magnetic field generating apparatus, and more particularly to a method and apparatus for homogenizing the strength distribution of a magnetic field generated in a space between a pair of facing pole surfaces, and an apparatus for generating a homogeneous magnetic field in a space between a pair of facing pole surfaces.

In a conventional apparatus for generating a homogeneous magnetic field in a space between a pair of facing pole surfaces, the strength distribution of the magnetic field is finely adjusted by magnetic elements disposed on flat plates provided over pole surfaces in parallel to attain desired homogeneity. The positions at which the magnetic elements can be disposed on the flat plates are prefixed, and which magnetic element is to be disposed at which position is determined by trial and error.

Since the conventional method requires repetitive trial and error, it is inefficient.

SUMMARY OF THE INVENTION

It is therefore an object of the present invention to provide a method and apparatus for efficiently homogenizing a magnetic field, and a magnetic field generating apparatus in which magnetic field homogenization is efficiently achieved.

(1) The present invention, in one aspect thereof for solving the aforementioned problem, is a magnetic field homogenizing method for homogenizing a strength distribution of a magnetic field generated in a space between a pair of facing pole surfaces, characterized in comprising: determining a continuous magnetization distribution for homogenizing the strength distribution of said magnetic field with respect to planes on which magnetic elements are to be disposed for homogenizing the strength distribution of said magnetic field; and disposing magnetic elements on said planes based on said magnetization distribution.

(2) The present invention, in another aspect thereof for solving the aforementioned problem, is a magnetic field homogenizing apparatus for homogenizing a strength distribution of a magnetic field generated in a space between a pair of facing pole surfaces, characterized in comprising: calculating means for determining a continuous magnetization distribution for homogenizing the strength distribution of said magnetic field with respect to planes on which magnetic elements are to be disposed for homogenizing the strength distribution of said magnetic field; and disposing means for disposing magnetic elements on said planes based on said magnetization distribution.

(3) The present invention, in still another aspect thereof for solving the aforementioned problem, is a magnetic field generating apparatus for generating a magnetic field in a space between a pair of facing pole surfaces, characterized in comprising: planes on which magnetic elements are to be disposed; and magnetic elements disposed on said planes based on a continuous magnetization distribution over said plane determined to homogenize a strength distribution of the magnetic field in said space.

In the invention of the aforementioned aspects, a continuous magnetization distribution for homogenizing the strength distribution of the magnetic field is determined with respect to planes on which magnetic elements are to be disposed for homogenizing the strength distribution of the magnetic field, and magnetic elements are disposed based on the magnetization distribution; therefore, a magnetic field can be efficiently homogenized.

The magnetization distribution is preferably determined as a polynomial of an orthogonal function so that the continuous magnetization distribution may be efficiently determined.

The polynomial is preferably determined by an optimization method so that an optimum polynomial may be determined.

The optimization method is preferably a method of least squares so that the optimization may be effectively achieved.

The disposition of the magnetic elements is preferably achieved based on the magnetization distribution that is discretized so that the magnetic elements may be properly disposed.

The planes are preferably the pole surfaces so that efficiency of space use may be improved.

Therefore, the present invention provides a method and apparatus for efficiently homogenizing a magnetic field, and a magnetic field generating apparatus in which magnetic field homogenization is efficiently achieved.

Further objects and advantages of the present invention will be apparent from the following description of the preferred embodiments of the invention as illustrated in the accompanying drawings.

BRIEF DESCRIPTION OF THE DRAWINGS

FIG. 7 is a block diagram of an embodiment of the present invention.

DETAILED DESCRIPTION OF THE INVENTION

Figure 1:
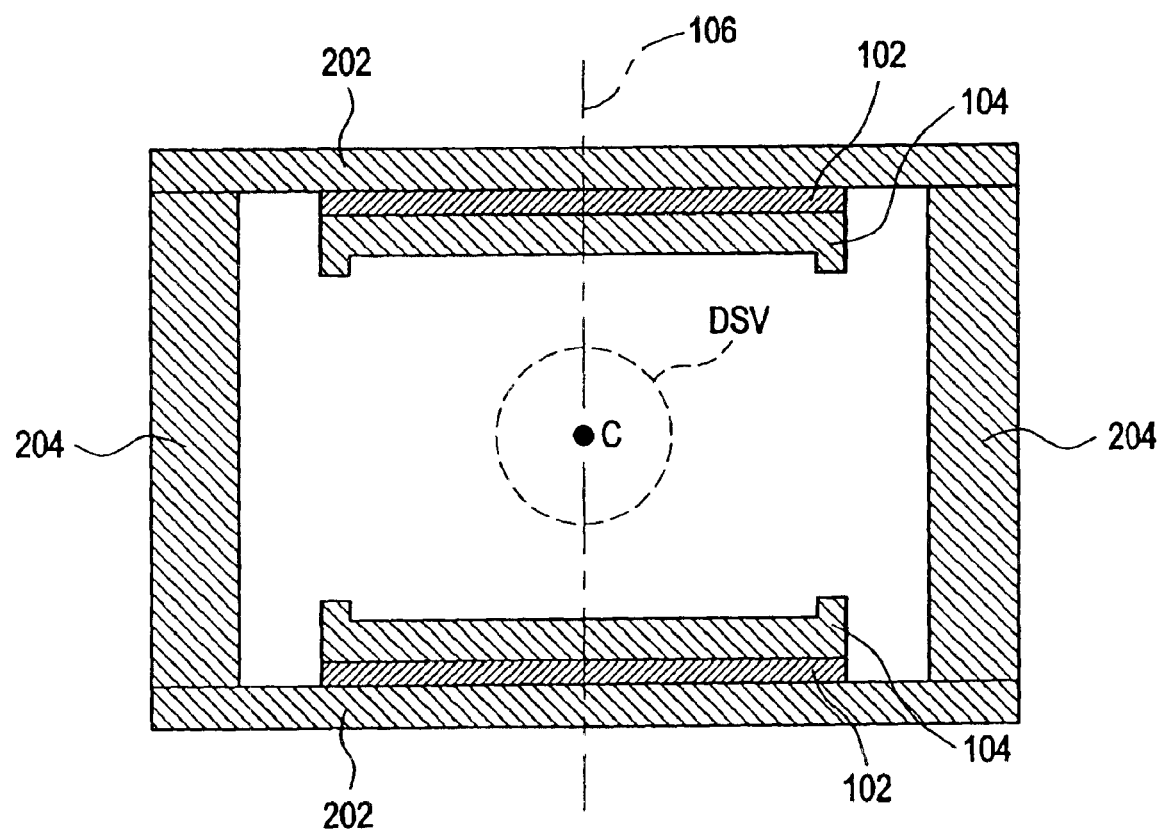
FIG. 1 shows an embodiment of the present invention.

Embodiments of the present invention will now be described in detail with reference to the accompanying drawings. FIG. 1 schematically shows a configuration of a magnetic field generating apparatus in a cross-sectional view. The apparatus is an embodiment of the present invention. The configuration of the apparatus represents an embodiment of the magnetic field generating apparatus in accordance with the present invention.

As shown, the present apparatus has a pair of horizontal yokes 202 and a pair of vertical yokes 204. The horizontal yokes 202 have a generally plate-like outer shape. FIG. 1 shows their thickness. The vertical yokes 204 have a generally columnar outer shape. FIG. 1 shows their thickness.

The pair of horizontal yokes 202 are supported facing each other across a space by the pair of vertical yokes 204. The yokes are made of a magnetic material such as soft iron, and they together form a magnetic circuit for magnets described below. It should be noted that one of the pair of vertical yokes 204 may be omitted.

The facing surfaces of the pair of horizontal yokes 202 are provided with a pair of magnets 102. The magnets 102 have a generally disk-like outer shape. FIG. 1 shows their thickness. The pair of magnets 102 are magnetized in their thickness direction to have the same polarity. Permanent magnets, for example, are employed as the magnets 102. But the magnets 102 are not limited to permanent magnets, and may be made using super or normal conductive electromagnets or the like.

Poles of the pair of magnets 102 that lie on respective sides opposite to the horizontal yokes 202 are provided with a pair of pole pieces 104. The pole pieces 104 are made of a magnetic material such as soft iron, and they serve as magnetism conditioning plates for the magnets 102. The pole pieces 104 also have a disk-like outer shape, and FIG. 1 shows their thickness.

The pair of magnets 102 provided with the pole pieces 104 have a common center axis 106. Facing surfaces of the pair of pole pieces 104 serve as a pair of pole surfaces of the present apparatus. The pair of pole surfaces have mutually opposite polarities. A magnetic field is generated in the space between the poles. The direction of the magnetic field is vertical in FIG. 1. The magnetic field is sometimes referred to as a vertical magnetic field.

Magnetic field strength homogenization is performed on this magnetic field. Magnetic field strength homogenization is sometimes referred to as shimming. The shimming is performed so that the spatial distribution of the strength of the magnetic field is homogenized within a spherical region (DSV: diameter spherical volume) of prescribed diameter whose center is the magnet center C.

Now a method of shimming will be described. The shimming method described below is an embodiment of the present invention. The method represents an embodiment of the magnetic field homogenizing method in accordance with the present invention.

The shimming uses magnetic elements that are permanent magnets, for example. The magnetic elements are attached to the end surfaces of the pole pieces 104 to correct for inhomogeneity of the magnetic field in the DSV. The magnetic elements will be sometimes referred to as shim magnets hereinbelow. The shim magnets represent an embodiment of the magnetic elements in accordance with the present invention. The end surfaces of the pole pieces 104 represent an embodiment of the planes in accordance with the present invention.

The shim magnets may be attached to dedicated support plates provided over the end surfaces of the pole pieces 104, instead of being attached to the end surfaces of the pole pieces 104. However, they are preferably attached directly to the end surfaces of the pole pieces 104 so that efficiency of space utilization may be improved. While the following description will be made on a case in which the shim magnets are attached to the end surfaces of the pole pieces 104, the same applies to a case in which they are attached to dedicated support plates.

Figure 2:
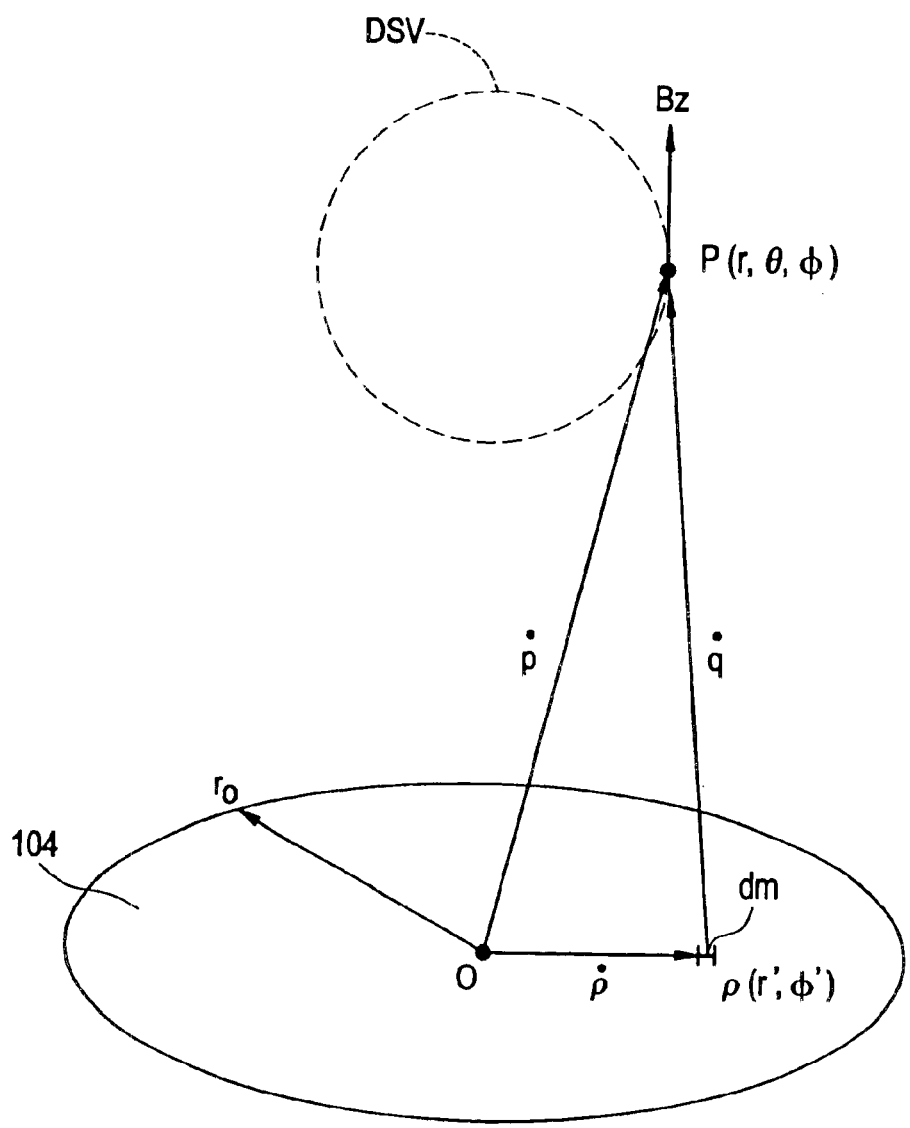
FIG. 2 shows a magnetic field generated in a DSV by small magnetization.

A magnetic field generated in the DSV by the magnetization of the shim magnets provided on the end surfaces of the pole pieces 104 can be determined by a calculation. Specifically, as shown in FIG. 2, when a magnetic field generated at a point P on a surface of a DSV by small magnetization dm lying at a point ρ on an end surface of the pole piece 104 is represented by Bzp, the magnetic field Bzp is given by the following equation

[Equation 1]

$$B_{zp} = \frac{1}{4\pi}\left(-\frac{dm\hat{Y}}{q^3} + \frac{3(dm\hat{Y} \cdot q\hat{Y})q\hat{Y}}{q^5}\right), \quad (1)$$

[Equation 2]

$$qY = pY - \rho Y, \quad (2)$$

where
[Equation 3]

pY is a vector directed from an origin O to the point P, and
[Equation 4]

ρY is a vector directed from the origin O to the point ρ. It should be noted that the origin O is defined at the center of the pole piece.

When the magnetic field Bzp is generally represent by:

[Equation 5]

$$B_{zp} = \Psi(r, \theta, \phi, r', \phi')dm, \quad (3)$$

a magnetic field Bz(P) generated at the point P by the distribution m(ρ) of the small magnetization present on the end surface of the pole piece can be calculated by the following equation:
[Equation 6]

$$B_z(P) = \int_0^{2\pi r} \int_0^{r0} \Psi r' dr' d\phi' m(\rho); \quad (4)$$

where r, θ and φ are polar coordinates of the point P, and r' and φ' are polar coordinates of the point ρ. Moreover, r0 designates the radius of a region within which the shim magnets are to be disposed.

The shimming is achieved by correcting the magnetic field strength at the point P by such a magnetic field Bz(P). A plurality of the points P are defined over the surface of the DSV. Moreover, the magnetic field strength at the points P before shimming are measured beforehand.

Figure 3:
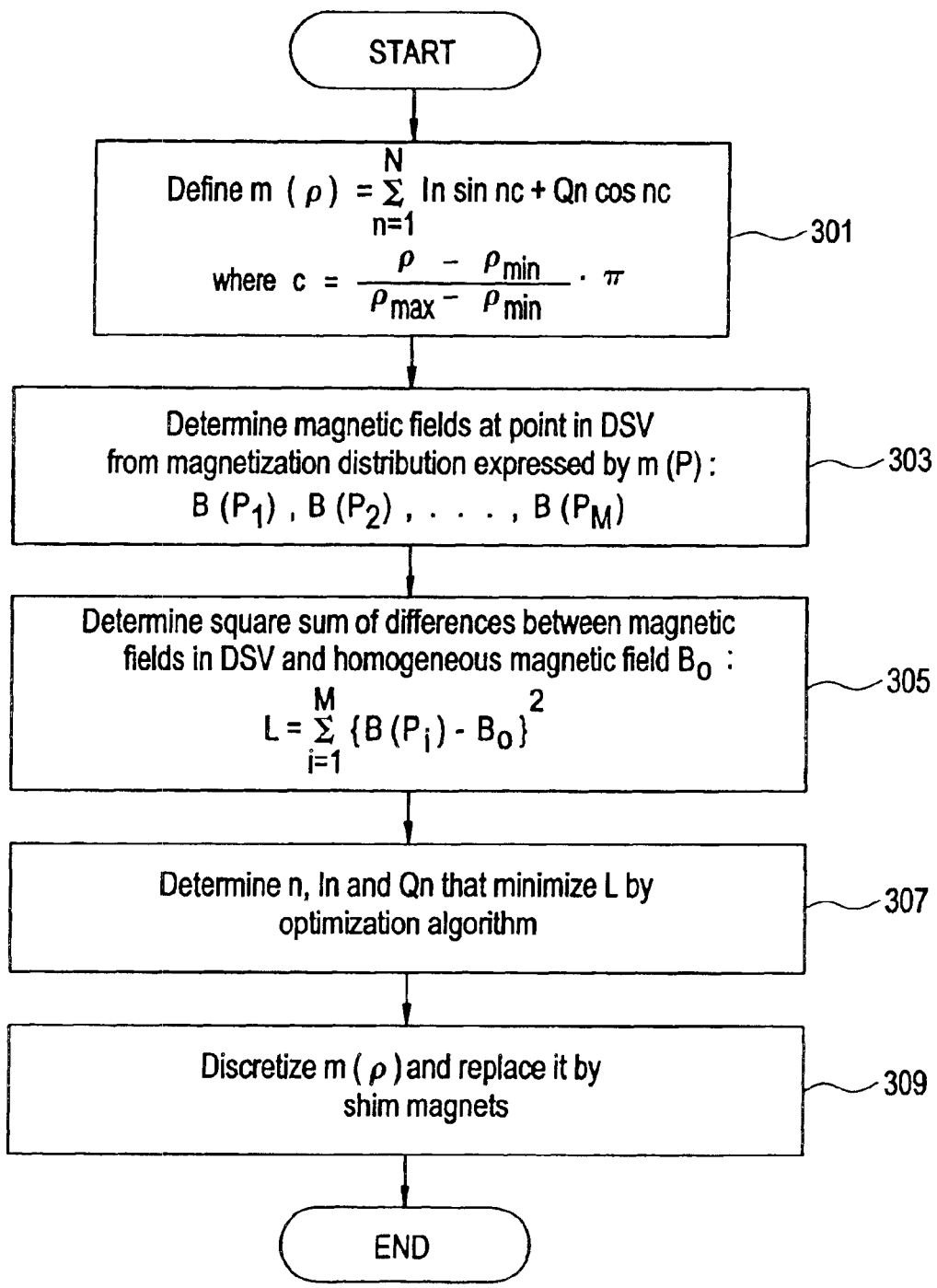
FIG. 3 is a flow chart showing a shimming method.

FIG. 3 shows a flow chart of the shimming. As shown, at Step 301, the magnetization distribution m(ρ) is expressed by a polynomial of an orthogonal function. Specifically,
[Equation 7]

$$m(\rho) = \sum_{n=1}^{N} I_n \sin nc + Q_n \cos nc, \quad (5)$$

[Equation 8]

$$c = \frac{\rho - \rho_{\min}}{\rho_{\max} - \rho_{\min}} \cdot \pi. \quad (6)$$

Using such a polynomial of an orthogonal function, m(ρ) becomes a continuous function.

Next, at Step 303, a magnetic field at each point on the DSV is determined from the magnetization distribution expressed by m(ρ). Specifically, magnetic fields B(P1), B(P2), ..., B(PM) are determined by adding the magnetic fields from the magnetization distribution m(ρ) to the magnetic fields before shimming at the points P1, P2, ..., Pm on the DSV. The magnetic fields at the points P1, P2, ..., Pm on the DSV by the magnetization distribution m(ρ) are given by Equation (4).

Next, at Step 305, a square sum of differences between magnetic fields of the DSV and a homogeneous magnetic field B0 is determined. Specifically,

[Equation 9]

$$L = \sum_{i=1}^{M} \{B(P_i) - B_0\}^2, \quad (7)$$

where the homogeneous magnetic field B0 is the shimming target value.

Next, at Step 307, n, In and Qn that minimize L are determined by an optimization algorithm. The optimization algorithm employed is a method of least squares, for example. This gives an optimum magnetization distribution m(ρ) for bringing the DSV to the homogeneous magnetic field B0, with good accuracy.

Figure 4:
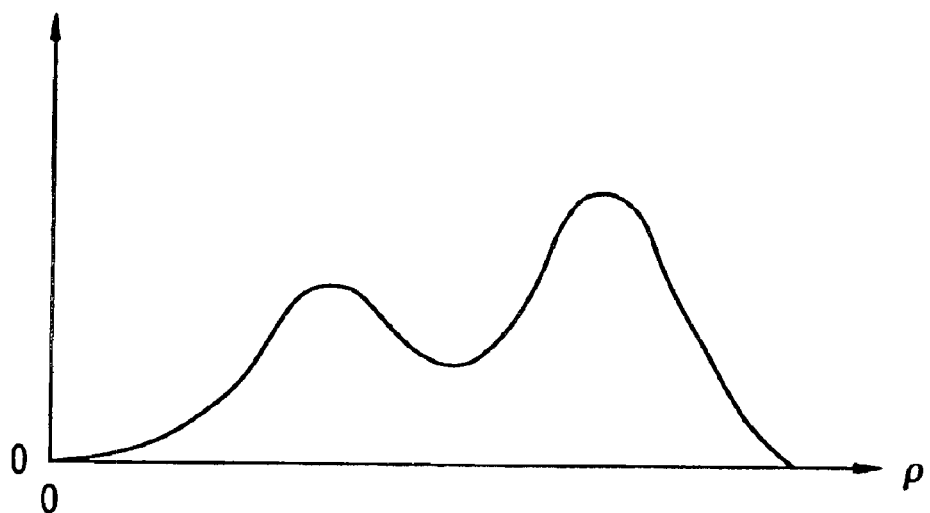
FIG. 4 shows a continuous magnetization distribution.

The magnetization distribution m(ρ) thus determined is a continuous function as exemplarily shown in FIG. 4. The polynomial of an orthogonal function is suitable for expressing such a continuous distribution having a plurality of peak values as shown in FIG. 4.

Figure 5:
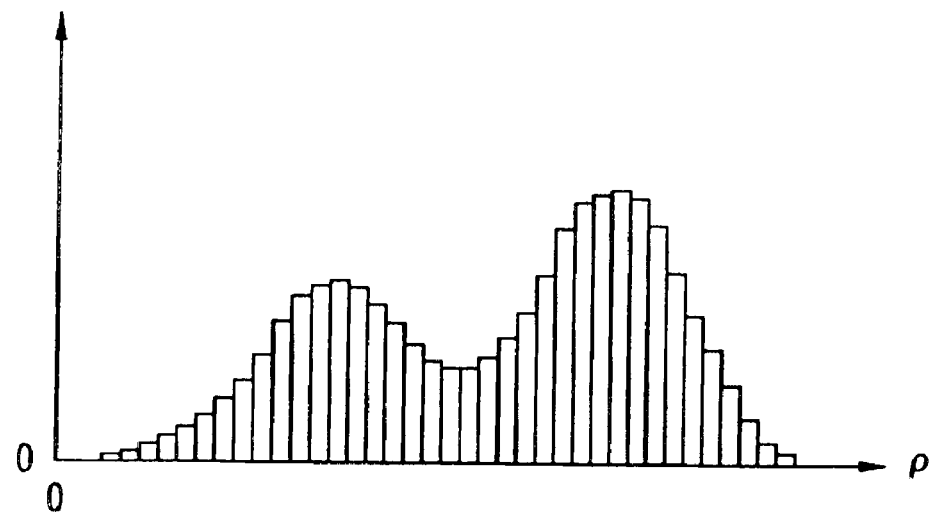
FIG. 5 shows a discretized magnetization distribution.

Next, at Step 309, m(ρ) is discretized and replaced by shim magnets. Specifically, the magnetism distribution m(ρ) is discretized along a ρ axis as exemplarily shown in FIG. 5, and shim magnets having respective magnetization corresponding to those at the discretized positions are attached to the end surfaces of the pole pieces 104.

Figure 6:
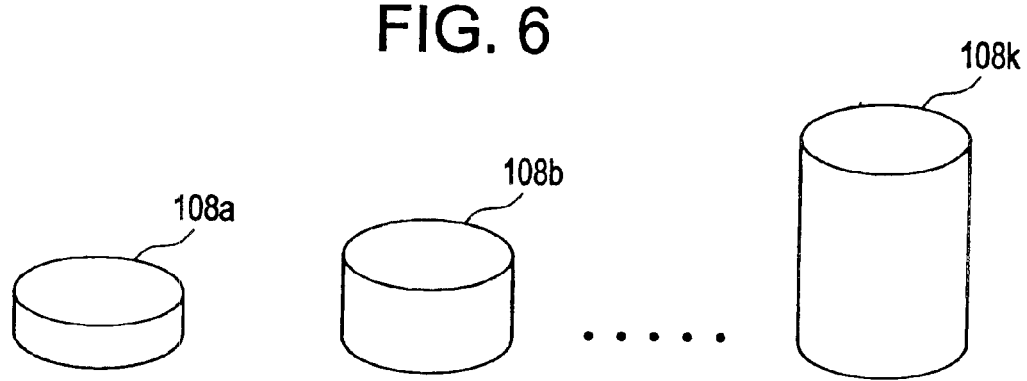
FIG. 6 shows shim magnets.

A plurality of types of shim magnets 108a, 108b, ..., 108k having different magnetization are prepared beforehand, as exemplarily shown in FIG. 6, and desired magnetization is preferably achieved by choosing from among or combining these shim magnets.

Since magnetization for shimming is thus determined as a continuous distribution, which is discretized and replaced by shim magnets, efficient shimming can be achieved without relying upon human trial and error. Positions for attaching the shim magnets are not prefixed, unlike in the conventional technique, and the shim magnets may be attached to optimal positions according to the magnetization distribution, thus improving shimming precision.

FIG. 7 shows a block diagram of a magnetic field homogenizing apparatus for achieving the shimming as described above. The apparatus is an embodiment of the present invention. The configuration of the apparatus represents an embodiment of the magnetic field homogenizing apparatus in accordance with the present invention.

As shown, the present apparatus has a magnetization distribution calculating section 702 and a magnetic element disposing section 704. The magnetization distribution calculating section 702 executes Steps 301–307 in the flow chart shown in FIG. 3. The magnetic element disposing section 704 executes Step 309 in the flow chart shown in FIG. 3.

The magnetization distribution calculating section 702 is implemented by a computer, for example. The magnetic element disposing section 704 is implemented by a robot, for example, that performs attachment of the shim magnets to the end surfaces of the pole pieces 104 under control of a computer. The attachment of the shim magnets to the end surfaces of the pole pieces 104 is achieved by an adhesive, for example.

While the present invention has been described with reference to preferred embodiments hereinabove, various changes or substitutions may be made on these embodiments by those ordinarily skilled in the art pertinent to the present invention without departing from the technical scope of the present invention. Therefore, the technical scope of the present invention encompasses not only those embodiments described above but all that fall within the scope of the appended claims.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic field homogenizing method for homogenizing a strength distribution of a magnetic field generated in a space between a pair of facing pole surfaces, comprising the steps of:

determining a continuous magnetization distribution with respect to planes including one of a plurality of said pole surfaces and a plurality of plates attached to said pole surfaces on which magnetic elements including shim magnets are to be disposed for homogenizing the strength distribution of said magnetic field; and disposing said magnetic elements on said planes based on said magnetization distribution, wherein said determining the magnetization distribution includes optimizing the magnetization distribution before said disposing said magnetic elements on said planes.

2. The magnetic field homogenizing method of claim 1, wherein said magnetization distribution is determined as a polynomial of an orthogonal function.

3. The magnetic field homogenizing method of claim 2, wherein said polynomial is determined by an optimization method.

4. The magnetic field homogenizing method of claim 3, wherein said optimization method is a method of least squares.

5. The magnetic field homogenizing method of claim 1, wherein said disposition of said magnetic elements is achieved based on said magnetization distribution that is discretized.

6. The magnetic field homogenizing method of claim 1, wherein said planes are said pole surfaces.

7. A magnetic field homogenizing apparatus for homogenizing a strength distribution of a magnetic field generated in a space between a pair of facing pole surfaces, comprising:

a calculating device configured to determine a continuous magnetization distribution with respect to planes on which magnetic elements are to be disposed for homogenizing the strength distribution of said magnetic field, wherein said planes include one of a plurality of said pole surfaces and a plurality of plates attached to said pole surfaces; and a disposing device configured to dispose said magnetic elements on said planes based on said magnetization distribution, wherein said magnetic elements include shim plates, and said calculating device determines the magnetization distribution by optimizing the magnetization distribution before said disposing device disposes said magnetic elements.

8. The magnetic field homogenizing apparatus of claim 7, wherein said calculating device determines said magnetization distribution as a polynomial of an orthogonal function.

9. The magnetic field homogenizing apparatus of claim 8, wherein said calculating device determines said polynomial by an optimization method.

10. The magnetic field homogenizing apparatus of claim 9, wherein said optimization method is a method of least squares.

11. The magnetic field homogenizing apparatus of claim 7, wherein said disposing method disposes said magnetic elements based on said magnetization distribution that is discretized.

12. The magnetic field homogenizing apparatus of claim 7, wherein said planes are said pole surfaces.

13. A magnetic field apparatus comprising:

a pair of facing pole surfaces, wherein a space is formed between said facing pole surfaces;

planes on which magnetic elements are to be disposed, wherein said planes include one of a plurality of said pole surfaces and a plurality of plates attached to said pole surfaces, said magnetic elements disposed on said planes based on a continuous magnetization distribution over said planes determined to homogenize a strength distribution of the magnetic field in said space, and said magnetic elements include shim magnets;

a first device; and a second device, wherein said first device configured to determine the magnetization distribution by optimizing the magnetization distribution before said second device disposes said magnetic elements on said planes.

14. The magnetic field apparatus of claim 13, wherein said magnetization distribution is determined as a polynomial of an orthogonal function.

15. The magnetic field apparatus of claim 14, wherein said polynomial is determined by an optimization method.

16. The magnetic field apparatus of claim 15, wherein said optimization method is a method of least squares.

17. The magnetic field apparatus of claim 13, wherein said magnetic elements are disposed based on said magnetization distribution that is discretized.

18. The magnetic field apparatus of claim 13, wherein said planes are said pole surfaces.

19. The magnetic field homogenizing method of claim 1, wherein said optimizing the continuous magnetization distribution comprises reducing a difference between said magnetic field and a homogeneous magnetic field.

* * * * *